US009922886B2

United States Patent
Cheng et al.

(10) Patent No.: US 9,922,886 B2
(45) Date of Patent: Mar. 20, 2018

(54) SILICON-GERMANIUM FINFET DEVICE WITH CONTROLLED JUNCTION

(71) Applicant: International Business Machines Corporation, Armonk, NY (US)

(72) Inventors: Kangguo Cheng, Schenectady, NY (US); Pouya Hashemi, White Plains, NY (US); Kam-Leung Lee, Putnam Valley, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/279,671

(22) Filed: Sep. 29, 2016

(65) Prior Publication Data

US 2017/0018466 A1  Jan. 19, 2017

Related U.S. Application Data

(62) Division of application No. 14/667,934, filed on Mar. 25, 2015, now Pat. No. 9,514,997.

(51) Int. Cl.
*H01L 21/335* (2006.01)
*H01L 21/84* (2006.01)
*H01L 29/66* (2006.01)
*H01L 29/06* (2006.01)
(Continued)

(52) U.S. Cl.
CPC ...... *H01L 21/845* (2013.01); *H01L 21/02694* (2013.01); *H01L 21/2253* (2013.01); *H01L 21/26506* (2013.01); *H01L 21/823814* (2013.01); *H01L 21/823821* (2013.01); *H01L 21/823864* (2013.01); *H01L 27/0924* (2013.01);
(Continued)

(58) Field of Classification Search
CPC ........... H01L 27/1211; H01L 29/66545; H01L 29/6656; H01L 29/785; H01L 21/845; H01L 21/02694; H01L 27/0924; H01L 29/0653; H01L 29/66795
See application file for complete search history.

(56) References Cited

U.S. PATENT DOCUMENTS 5,714,413 A   2/1998  Brigham et al.
5,943,565 A   8/1999  Ju
(Continued)

OTHER PUBLICATIONS

Bansal, et al.; "Optimal Dual-VT Design in Sub-100-nm PD/SOI and Double-Gate Technologies"; IEEE Transactions on Electron Devices; vol. 55; No. 5; May 2008; Copyright 2008.
(Continued)

*Primary Examiner* — Khiem D Nguyen
(74) *Attorney, Agent, or Firm* — Edward J. Wixted, III

(57) ABSTRACT

Embodiments of the invention include a method for forming a FinFET device and the resulting structure. A semiconductor device including a substrate, a silicon-germanium fin formed on the substrate, a dummy gate formed on the fin, and a first set of spacers formed on the exposed sidewalls of the dummy gate is provided. Xenon is implanted into the exposed portions of the fin. A second set of spacers are formed on the exposed sidewalls of the first set of spacer. A dopant is implanted into the exposed portions of the fin. The semiconductor device is thermally annealed, such that the dopants diffuse into the adjacent portions of the fin. The dummy gate is replaced with a gate structure.

11 Claims, 6 Drawing Sheets

(51) Int. Cl.
*H01L 29/161* (2006.01)
*H01L 29/167* (2006.01)
*H01L 29/78* (2006.01)
*H01L 21/02* (2006.01)
*H01L 21/225* (2006.01)
*H01L 21/265* (2006.01)
*H01L 21/8238* (2006.01)
*H01L 27/092* (2006.01)
*H01L 27/12* (2006.01)

(52) U.S. Cl.
CPC ........ *H01L 29/0653* (2013.01); *H01L 29/161* (2013.01); *H01L 29/167* (2013.01); *H01L 29/6656* (2013.01); *H01L 29/66545* (2013.01); *H01L 29/66795* (2013.01); *H01L 29/785* (2013.01); *H01L 27/1211* (2013.01); *H01L 29/6653* (2013.01)

(56) References Cited

U.S. PATENT DOCUMENTS

| | | | |
|---|---|---|---|
| 6,306,702 B1 | 10/2001 | Hao et al. | |
| 6,825,529 B2 | 11/2004 | Chidambarrao et al. | |
| 7,365,378 B2 | 4/2008 | Huang et al. | |
| 7,704,835 B2 | 4/2010 | Singh et al. | |
| 8,362,561 B2 | 1/2013 | Nuttinck et al. | |
| 8,383,503 B2 | 2/2013 | Johnson | |
| 8,598,663 B2 | 12/2013 | Cheng et al. | |
| 9,466,616 B2 | 10/2016 | Harley et al. | |
| 9,530,864 B2 | 12/2016 | Bentley et al. | |
| 2011/0117679 A1* | 5/2011 | Lee | H01L 29/41791 438/5 |
| 2012/0235239 A1* | 9/2012 | Cheng | H01L 21/84 257/350 |
| 2013/0161763 A1* | 6/2013 | Ando | H01L 29/78621 257/408 |
| 2013/0175618 A1* | 7/2013 | Cheng | H01L 21/82343 257/347 |
| 2016/0358775 A1 | 12/2016 | Kerber et al. | |

OTHER PUBLICATIONS

Appendix P: List of IBM Patents or Patent Applications Treated as Related; Dated Sep. 29, 2016; pp. 1-2.

U.S. Appl. No. 14/667,934, filed Mar. 25, 2015; Entitled "Silicon-Germanium FinFET Device With Controlled Junction".

* cited by examiner

US 9,922,886 B2

SILICON-GERMANIUM FINFET DEVICE WITH CONTROLLED JUNCTION

BACKGROUND OF THE INVENTION

The present invention relates generally to the field of transistors, and more particularly to controlling the junction of FinFET devices.

With the down scaling of integrated circuits and higher requirements for the number of transistors present in integrated circuits, transistors need to have higher drive currents with progressively smaller dimensions. In its basic form, a FinFET device includes a source, a drain and one or more fin-shaped channels between the source and the drain. A gate electrode over the fin(s) regulates electron flow between the source and the drain. In general, FinFET designs facilitate manufacturing smaller and smaller transistors, however controlling the fabrication steps required to create sufficiently small transistors is often problematic.

SUMMARY

Embodiments of the invention disclose a method of forming a silicon-germanium FinFET device with a controlled junction and a resulting structure. A semiconductor device including a substrate, a silicon-germanium fin formed on the substrate, a dummy gate formed on the fin, and a first set of spacers formed on the exposed sidewalls of the dummy gate is provided. Xenon is implanted into the exposed portions of the fin. A second set of spacers are formed on the exposed sidewalls of the first set of spacer. A dopant is implanted into the exposed portions of the fin. The semiconductor device is thermally annealed, such that the dopants diffuse into the adjacent portions of the fin. The dummy gate is replaced with a gate structure.

DETAILED DESCRIPTION

Embodiments of the present invention generally provide a silicon-germanium FinFET device with a controlled junction. A detailed description of embodiments of the claimed structures and methods are included herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale; some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the Figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1:
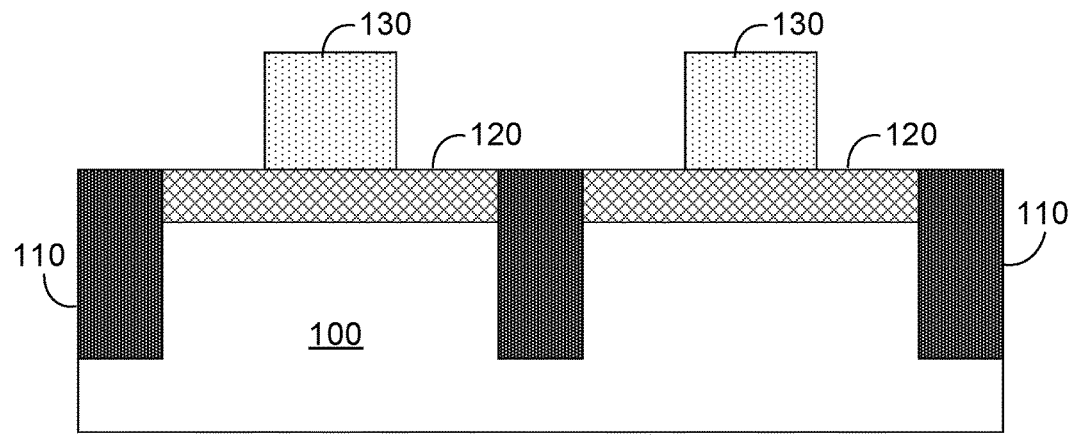
FIG. 1 illustrates a section view of a starting wafer including a semiconductor substrate, isolation, fin, and dummy gate on which the FinFET device of the invention is formed, in accordance with an embodiment of the invention.

The present invention will now be described in detail with reference to the Figures. FIG. 1 illustrates a section view of a starting wafer including semiconductor substrate 100, isolation 110, fin 120, and dummy gate 130, in accordance with an embodiment of the invention. Semiconductor substrate 100 is a substrate on which a FinFET device may be formed. Semiconductor substrate 100 is a semiconductor material, preferably a silicon-containing material including, but not limited to, silicon, germanium, silicon germanium alloys, germanium alloys, indium alloys, silicon carbon alloys, or silicon germanium carbon alloys.

In various embodiments, both NFET and PFET transistors may be constructed on the same wafer, and as a result different processing steps are required for the formation of NFETs and PFETs. In the embodiment depicted in FIG. 1, two transistors are shown. The transistor on the left side of FIG. 1 depicts a PFET transistor (herein referred to as the "PFET portion" of the device) while the transistor on the right side of FIG. 1 depicts an NFET transistor (herein referred to as the "NFET portion" of the device). It should be appreciated that the embodiment depicted in FIG. 1 is meant to illustrate the difference in processing steps required to form NFET and PFET transistors, in accordance with one embodiment of the invention, and is not intended to be limiting. In various embodiments, any number of NFET and PFET transistors may be present on the same wafer.

In some embodiments, a buried oxide layer (BOX) is present within semiconductor substrate 100. In general, this buried oxide layer acts as an electrical insulator below the FinFET transistor formed in various embodiments of the invention. In general, the thickness of semiconductor substrate 100 is between 100 μm and 1000 μm in various embodiments of the invention. While the depicted embodiment includes an illustration of bulk silicon construction, it should be appreciated by one skilled in the art that the invention is not limited to bulk silicon construction, and that other types of semiconductor construction can be used in various embodiments of the invention, for example, silicon on insulator (SOI) construction. In embodiments where bulk silicon construction is used (such as the embodiment depicted in FIG. 1), the buried oxide layer may not be present in the starting wafer.

Isolation 110 is a portion of insulative material such as silicon dioxide ($SiO_2$) which electrically isolates different portions of fin 120 from each other, in accordance with an embodiment of the invention. In one embodiment, isolation 110 extends from the top of fin 120 into semiconductor substrate 100. In general, isolation 110 is formed such that no electrical connection is present between portions of fin 120 present on either side of isolation 110.

Fin 120 is the channel or "fin" of the FinFET device formed in embodiments of the present invention. In some embodiments, the current FinFET device being created is an n-type FinFET device including a p-type fin and n-type contacts for source and drain. In general, fin 120 is formed from the material of semiconductor substrate 100. In some embodiments the current FinFET device is a p-type FET including an n-type fin and p-type contacts for source and drain. In some embodiments, such as the embodiment depicted in FIG. 1, both p-type FinFETs and n-type FinFETs are utilized in conjunction for a device to operate correctly, and in these embodiments both n-type FinFETs and p-type FinFETs may be present on the same substrate. Other materials of which fin 120 may be formed include, but are not limited to germanium, or silicon-germanium alloy materials. In a preferred embodiment of the invention, fin 120 is composed of silicon-germanium containing at least 25% germanium. In one embodiment, fin 120 is between 5 nm and 50 nm thick and is preferably about 8 to 10 nm thick. In various embodiments, the process of forming fin 120 involves the use of sidewall image transfer (SIT) processes well known in the art. It should be appreciated that any known method for forming a semiconductor fin can be used in various embodiments of the invention.

In one embodiment, the patterning process used to define the semiconductor fins includes a sidewall image transfer (SIT) process. The SIT process includes forming a contiguous mandrel material layer (not shown) on the topmost surface of the structure. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of, for example, amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned using photolithography and etching steps to form a plurality of mandrel structures (also not shown).

Dummy gate 130 is used to define the shape of the gate terminal of the FinFET device formed in the following steps. In a preferred embodiment, dummy gate 130 is composed of poly-silicon, deposited using, for example, low pressure chemical vapor deposition (LPCVD). Other materials of which dummy gate 130 may be formed include, but are not limited to, silicon oxide, silicon oxide doped with carbon, titanium oxide, hafnium oxide, any other insulative material. In general, dummy gate 130 refers to each dummy gate depicted in FIG. 1 individually. In a preferred embodiment, dummy gate 130 is between 20 nm and 200 nm thick and is preferably about 70 nm thick. A person of ordinary skill in the art will recognize that chemical-mechanical planarization (CMP) steps may be inserted before and after the deposition of dummy gate 130 to ensure that the top surface of dummy gate 130 is relatively flat.

Figure 2:
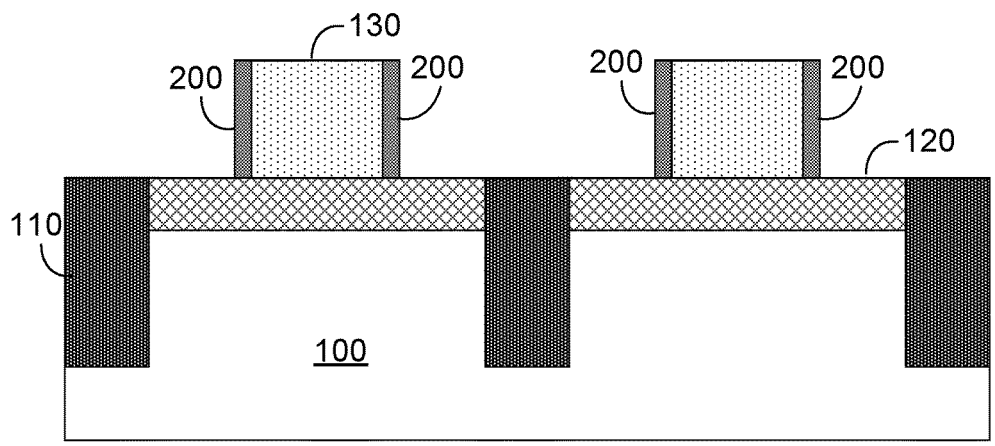
FIG. 2 depicts a section view of the formation of a spacer on the exposed sides of the dummy gate of FIG. 1, in accordance with an embodiment of the invention.

FIG. 2 depicts a section view of the FinFET device after forming spacer 200 on the exposed sides of dummy gate 130, in accordance with an embodiment of the invention. In various embodiments of the invention, spacer 200 comprises any dielectric spacer material including, for example, a dielectric oxide, dielectric nitride, and/or dielectric oxynitride. In one example, spacer 200 is composed of a non-conductive low-capacitance dielectric material such as Silicon dioxide ($SiO_2$). It should be appreciated that the material of which spacer 200 is formed is not limited to Silicon dioxide, and that any other acceptable materials for forming a dielectric spacer can be used in other embodiments. For example, the process of forming spacer 200 may include depositing a conformal layer (not shown) of insulating material, such as silicon nitride, over semiconductor substrate 100, isolation 110, fin 120, and dummy gate 130, such that the thickness of the deposited layer on the sidewall of dummy gate 130 and fin 120 is substantially the same as the thickness of the deposited layer on the surface of semiconductor substrate 100. Spacer 200 can be deposited using, for example, chemical vapor deposition (CVD), plasma enhanced chemical vapor deposition (PECVD), or physical vapor deposition (PVD). An anisotropic etch process, where the etch rate in the downward direction is greater than the etch rate in the lateral directions, may be used to remove portions of the insulating layer, thereby forming spacer 200. The etch process can be controlled such that the insulating layer may be removed from the sidewall of fin 120 while forming spacer 200.

Figure 3:
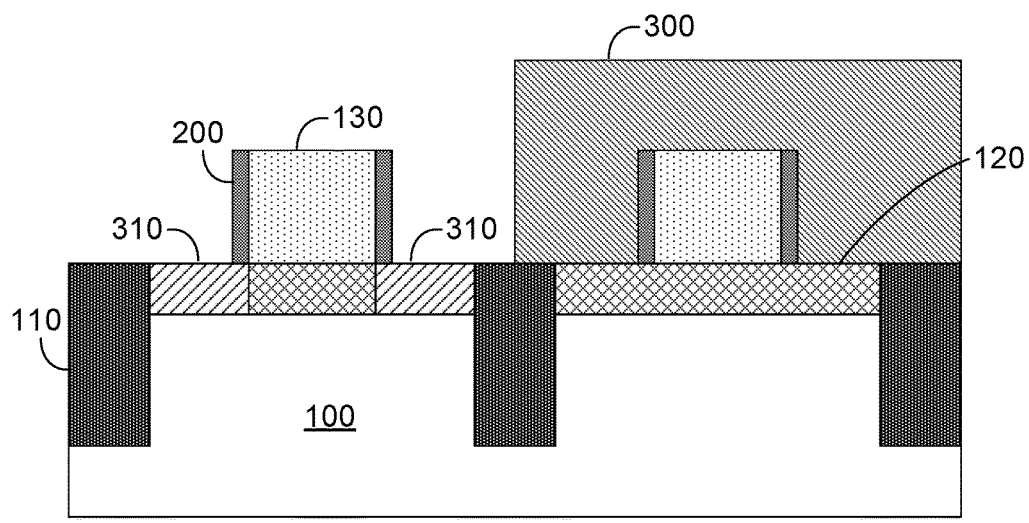
FIG. 3 depicts a section view of the formation of a hard mask and the implantation of p-type dopants into portions of the fin of FIG. 1, in accordance with an embodiment of the invention.

FIG. 3 depicts a section view of the FinFET device after the formation of hard mask 300 and the implantation of p-type dopants into portions of fin 120 not covered by dummy gate 130 or spacer 200 to form doped region 310 within fin 120, in accordance with an embodiment of the invention. Hard mask 300 is used to protect the NFET portion (the right side) of the FinFET device of the invention from the implantation of p-type dopants, in accordance with an embodiment of the invention. It should be appreciated that hard mask 300 is used in embodiments where NFETs and PFETs are formed on the same wafer, and may not be included in embodiments where only NFETs or PFETs are formed on a single wafer. In various embodiments, the p-type dopants implanted into fin 120 to form doped region 310 can be any p-type dopant such as boron implanted using a process such as ion implantation. In the depicted embodiment, doped region 310 is formed by the implantation of boron into the exposed portions of fin 120. In some embodiments, such as the depicted embodiment, implantation of boron occurs in at least a portion of fin 120 present under spacer 200, as depicted in FIG. 3.

In various embodiments, hard mask 300 is composed of, for example, a dielectric material such as silicon nitride, silicon oxide, or a combination of silicon nitride and silicon oxide deposited using, for example, a process such as LPCVD. In various embodiments, standard photolithographic processes are used to define the pattern of hard mask 300 in a layer of photoresist (not shown) deposited on hard mask 300. The desired hard mask pattern may then be formed in hard mask 300 by removing hard mask 300 from the areas not protected by the pattern in the photoresist layer. Hard mask 300 is removed using, for example, reactive ion etching (RIE). RIE uses chemically reactive plasma, generated by an electromagnetic field, to remove various materials. A person of ordinary skill in the art will recognize that the type of plasma used will depend on the material of which hard mask 300 is composed, or that other etch processes such as wet chemical etching or laser ablation may be used.

Figure 4:
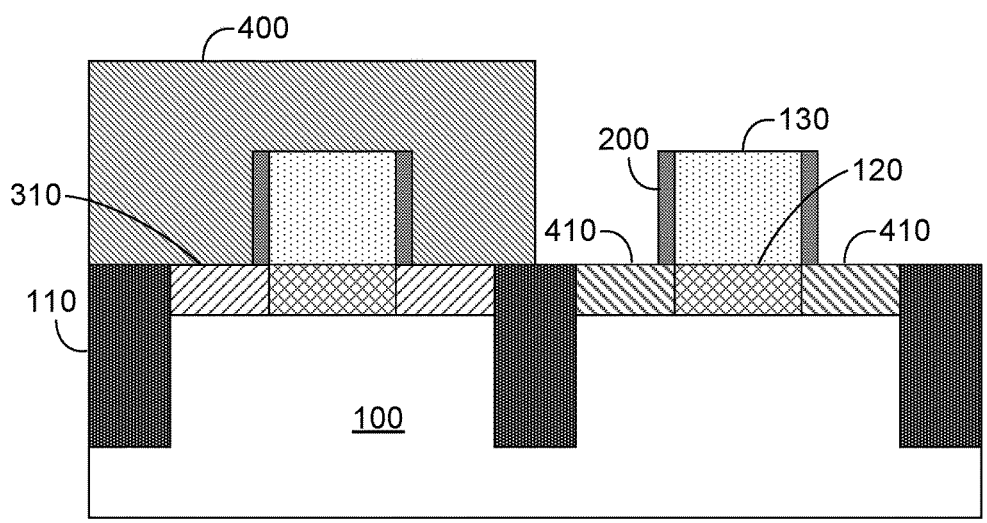
FIG. 4 depicts a section view of the removal of the hard mask of FIG. 3, the formation of a new hard mask, and the implantation of xenon into portions of the fin of FIG. 1.

FIG. 4 depicts a section view of the FinFET device after the removal of hard mask 300, the formation of hard mask 400, and the implantation of xenon into exposed portions of fin 120 to form diffusion stop region 410, in accordance with an embodiment of the invention. Similarly to hard mask 300, hard mask 400 is used to protect the PFET portion (the left side) of the FinFET device of the invention from the implantation of xenon, in accordance with an embodiment of the invention. It should be appreciated that hard mask 400 is used in embodiments where NFETs and PFETs are formed on the same wafer, and may not be included in embodiments where only NFETs or PFETs are formed on a single wafer.

In general, the process of removing hard mask 300 involves the use of an etching process such as RIE, laser ablation, or any etch process which can be used to selectively remove a portion of material such as hard mask 300. In various embodiments, hard mask 400 is composed of, for example, a dielectric material such as silicon nitride, silicon oxide, or a combination of silicon nitride and silicon oxide deposited using, for example, a process such as LPCVD. In various embodiments, standard photolithographic and etching processes may be used to define the structure of hard mask 400.

In various embodiments of the invention, xenon is implanted into exposed portions of fin 120 to form diffusion stop region 410. The purpose of diffusion stop region 410 is to decrease the rate at which n-type dopants such as arsenic (added in later processing steps) diffuse into fin 120. N-type dopants such as arsenic diffuse in silicon-germanium and germanium at a faster rate than p-type dopants in silicon-germanium and germanium as well as n-type dopants in silicon. Diffusion stop region 410 is used to decrease the rate at which n-type dopants such as arsenic diffuse into fin 120 to make the rates at which p-type and n-type dopants diffuse into fin 120 during the annealing process more similar. In a preferred embodiment, xenon is chosen because of its large atomic size and inert properties, however in other embodiments, other elements, preferably noble gases, can be used to implant fin 120 to form diffusion stop region 410. In general, the amount of xenon implanted into fin 120 is related to the percentage of germanium included in fin 120. For example, in an embodiment where fin 120 is composed of 25 percent germanium and 75 percent silicon, less xenon is implanted than an embodiment where fin 120 is composed of 50 percent germanium and 50 percent silicon.

Figure 5:
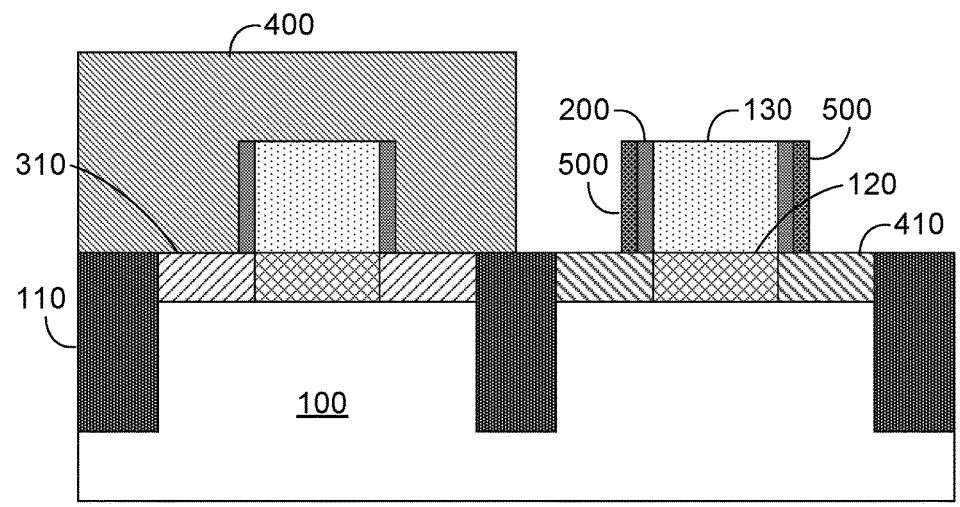
FIG. 5 illustrates a section view of the formation of a spacer on the exposed sides of spacer 200, in accordance with an embodiment of the invention.

FIG. 5 illustrates a section view of the FinFET device after the formation of spacer 500 on the exposed sides of spacer 200, in accordance with an embodiment of the invention. For example, forming spacer 500 may include depositing a conformal layer (not shown) of insulating material, such as silicon nitride, over semiconductor substrate 100, isolation 110, fin 120, dummy gate 130, and spacer 200, such that the thickness of the deposited layer on the sidewall of spacer 200 and fin 120 is substantially the same as the thickness of the deposited layer on the surface of semiconductor substrate 100. In one embodiment of the invention, spacer 200 is composed of a nitride material such as silicon nitride and spacer 500 is composed of an oxide material such as silicon oxide. An anisotropic etch process, where the etch rate in the downward direction is greater than the etch rate in the lateral directions, may be used to remove portions of the insulating layer, thereby forming spacer 500. The etch process can be controlled such that the insulating layer may be removed from the sidewall of fin 120 while forming spacer 500. In various embodiments, the material of which spacer 500 is formed is selected in order to have etch selectivity to spacer 200, i.e. it is possible to etch each spacer independently without damaging the other spacer.

Figure 6:
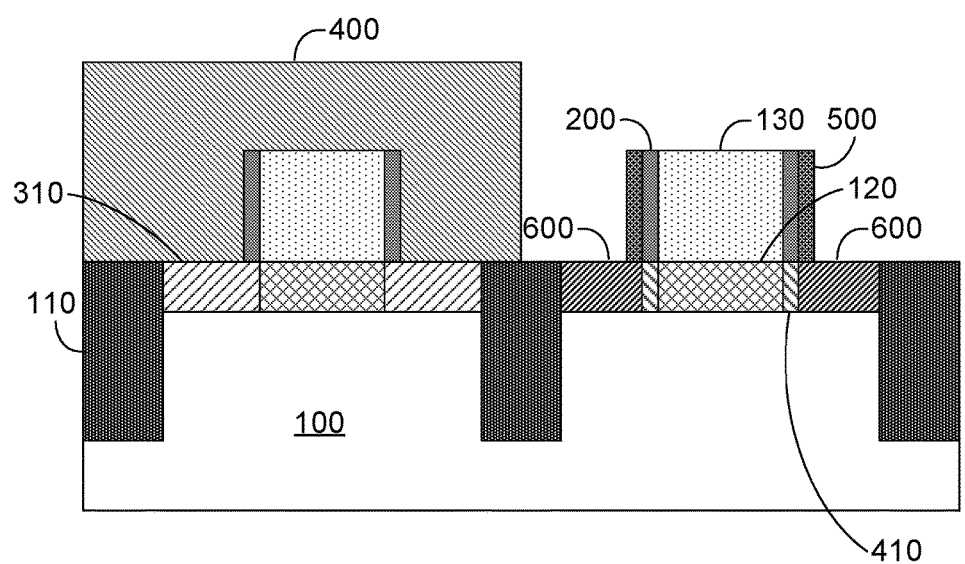
FIG. 6 depicts the implantation of n-type dopants into portions of the fin of FIG. 1, in accordance with an embodiment of the invention.

FIG. 6 depicts a section view of the FinFET device after the implantation of n-type dopants into the exposed portions of fin 120 to form doped region 600, in accordance with an embodiment of the invention. In the depicted embodiment, the portion of fin 120 which is to be doped to form doped region 600 is defined by the exposed region of fin 120 which is not covered by dummy gate 130, spacer 200, or spacer 500. Additionally, hard mask 400 is used to protect the entire PFET portion of the current device from the implantation of n-type dopants. In one embodiment, arsenic is implanted into fin 120 to form doped region 600, however in other embodiments other n-type dopants can be implanted into fin 120 to form doped region 600. In one embodiment, ion implantation is used to implant the n-type dopants into fin 120, however in other embodiments any known method for implanting a dopant into a semiconductor fin can be used.

Figure 7:
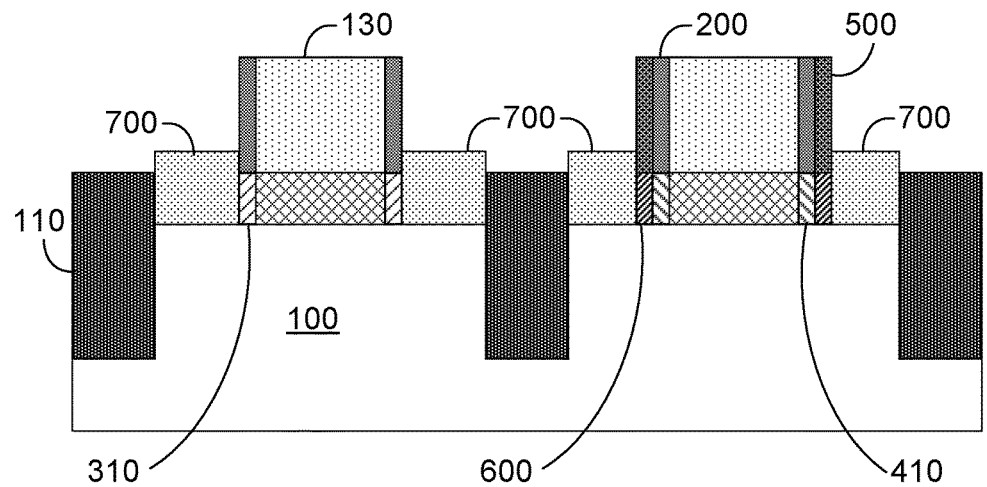
FIG. 7 illustrates the epitaxial growth of source and drain regions on the exposed portions of the fin of FIG. 1, in accordance with an embodiment of the invention.

FIG. 7 illustrates a section view of the FinFET device after the epitaxial growth of source and drain regions 700, in accordance with an embodiment of the invention. In embodiments where the current device is an NFET, such as the NFET portion of the current device, source and drain region 700 is composed of silicon or silicon-germanium doped with n-type dopants such as Phosphorus, Arsenic, or Antimony. In embodiments where the current device is a PFET, such as the PFET portion of the current device, source and drain region 700 is composed of silicon-germanium doped with a p-type dopant such as boron. In general, source and drain region 700 is composed of a material with an opposite conductivity type of the material of which fin 120 is composed. Forming source and drain region 700 on the exposed portions of fin 120 involves forming source and drain region 700 using a process such as selective chemical vapor deposition (CVD), or any other technique known in the art for epitaxially growing a layer of a semiconductor material. In general, source and drain region 700 is present on both exposed sides of each portion of fin 120. For each pair of source and drain region 700, one source and drain region 700 will act as the source terminal while the other source and drain region 700 located on the other side of dummy gate 130 will act as the drain terminal for the given FinFET device.

Figure 8:
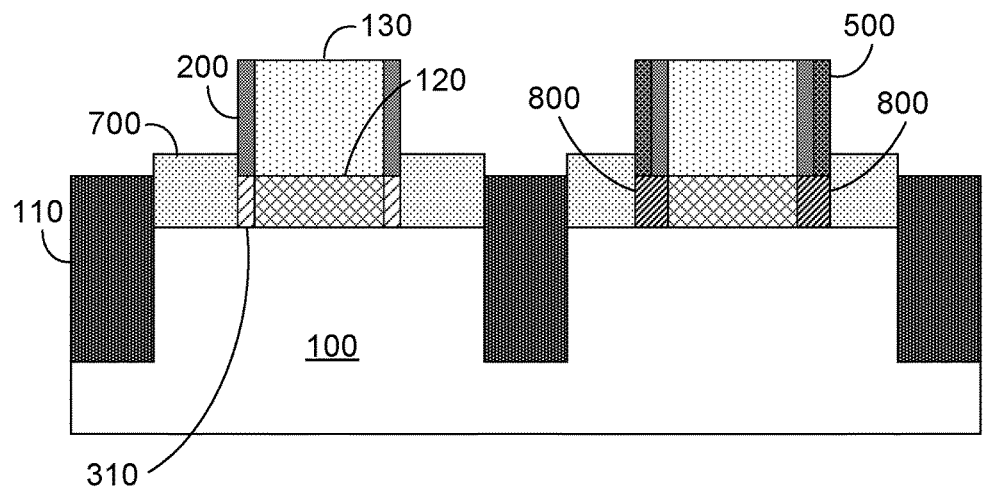
FIG. 8 depicts the results of thermally annealing the FinFET device of the invention, in accordance with an embodiment of the invention.

FIG. 8 depicts a section view of the FinFET device after annealing the FinFET device to form annealed region 800, in accordance with an embodiment of the invention. In one embodiment, a thermal annealing process is used to anneal the junction of the current device by inducing a high temperature to the current FinFET device in order to allow the dopants to diffuse into fin 120. In general, the boron implanted into the PFET portion of the current FinFET device has a very low diffusion rate in embodiments where fin 120 includes a large portion of germanium, such as Silicon-germanium including more than 25 percent Germanium. As a result of this low diffusion rate of boron, the change in the size of doped region 310 is considered to be insignificant as a result of the annealing process. The diffusion rate of arsenic implanted in the NFET portion of the device is significantly higher than the diffusion rate of boron in embodiments where fin 120 includes a large portion of germanium. As a result of the higher diffusion rate of arsenic, xenon is implanted into fin 120 (see FIG. 5) before arsenic is implanted into fin 120 (see FIG. 6) in order to reduce the diffusion rate of arsenic into fin 120. In general, the amount of xenon implanted into fin 120 and the temperature at which the FinFET device is annealed are modified in order to control the diffusion of arsenic into fin 120 in order to align the edge of annealed region 800 with the inner edge of spacer 200.

Figure 9:
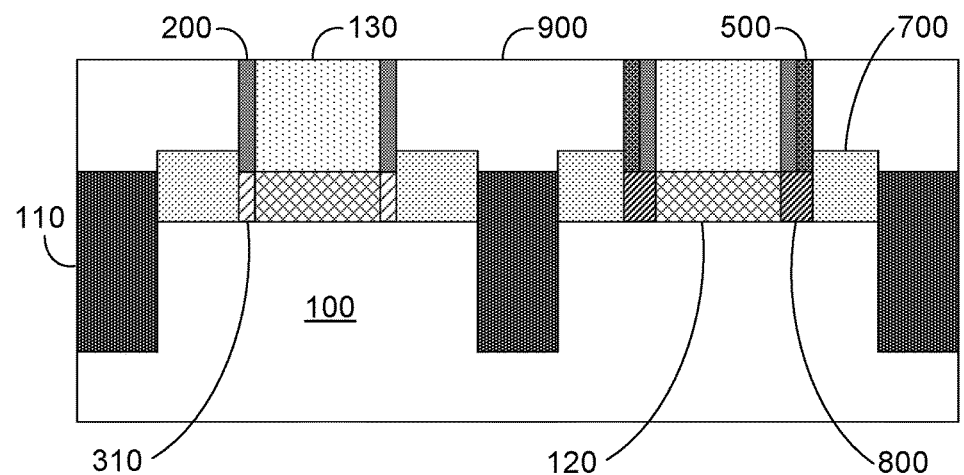
FIG. 9 depicts the deposition and planarization of an interlayer dielectric, in accordance with an embodiment of the invention.

FIG. 9 depicts a section view of the FinFET device after the deposition and planarization of interlayer dielectric 900, in accordance with an embodiment of the invention. Interlayer dielectric 900 is used to electrically insulate the current FinFET device from outside electrical components. In a preferred embodiment, interlayer dielectric 900 is composed of silicon oxide, deposited using, for example, low pressure chemical vapor deposition (LPCVD). Other materials of which Interlayer dielectric 900 may be formed include, but are not limited to, doped carbon, silicon oxynitride, or any other insulative material. In general, Interlayer dielectric 900 extends vertically from the top of semiconductor substrate 100 to the top of dummy gate 130. A person of ordinary skill in the art will recognize that CMP steps may be required after the deposition of the material of which Interlayer dielectric 900 is formed to planarize the top of Interlayer dielectric 900 such that the top of Interlayer dielectric 900 is even with the top of dummy gate 130 and no portions of Interlayer dielectric 900 are present above the top of dummy gate 130.

Figure 10:
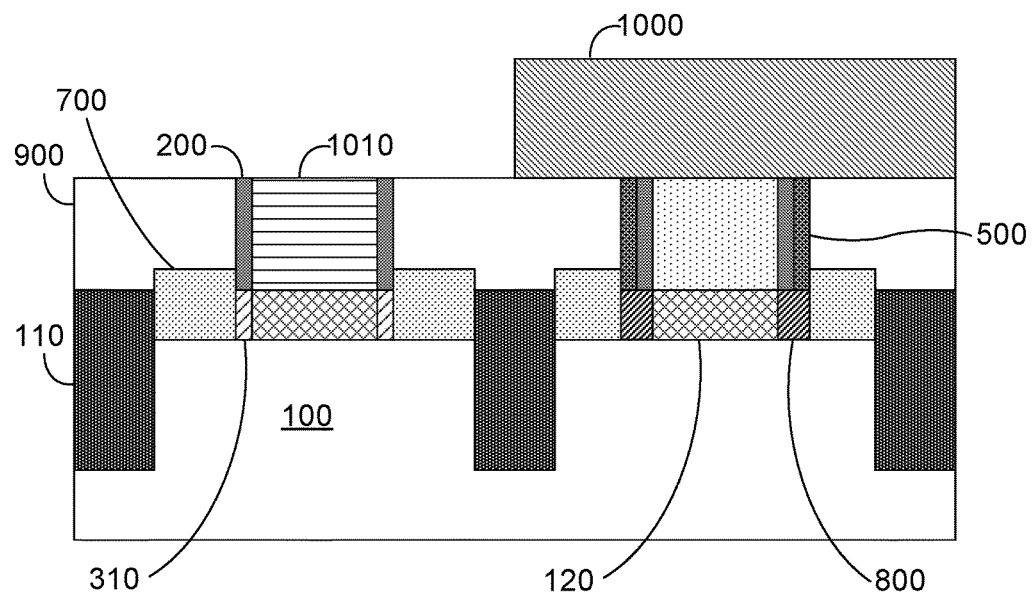
FIG. 10 depicts the formation of a hard mask and the replacement of the dummy gate of FIG. 1 with a metal gate, in accordance with an embodiment of the invention.

FIG. 10 illustrates a section view of the FinFET device of the invention after forming hard mask 1000, removing dummy gate 130, and forming a gate dielectric (not shown) and forming metal gate 1010 on the gate dielectric, in accordance with an embodiment of the invention. Collectively, the gate dielectric and metal gate 1010 may be referred herein as a gate structure.

In various embodiments of the invention the gate structure can be formed utilizing a gate-first or a gate-last process. In a gate-first process, the gate structure is formed first followed by the source/drain regions and optionally, merging of each of the source/drain regions.

In a gate-last process such as the embodiment depicted in FIGS. 1-12, the gate structure is formed after source/drain regions are formed. In such a process, a sacrificial gate material such as dummy gate 130 is formed on top of fin 120 and then source regions can be formed into exposed portions of fin 120 on one side of the sacrificial gate structure and then drain regions can be formed in exposed portions of fin 120 on the other side of the sacrificial gate structure. Next, the sacrificial gate structure may be replaced with a gate structure as defined above. The gate structure is used to control output current (i.e., flow of carriers in the channel) of a semiconducting device through electrical or magnetic fields.

In various embodiments, the material of which the gate dielectric is formed can be an oxide, nitride, and/or oxynitride. In one example, the gate dielectric material is a high-k dielectric material having a dielectric constant greater than that of silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric comprising different gate dielectric materials, e.g., silicon dioxide, and a high-k gate dielectric can be formed.

In some embodiments, some of the FinFET devices may include a first gate dielectric material, while the other FinFET devices may include a second gate dielectric material that is different from the first gate dielectric material.

The gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric. When a different material is used for the gate dielectric of various FinFET devices located on the same substrate, block mask technology can be used.

The material of which metal gate 1010 is formed can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, metal gate 1010 may comprise an nFET gate metal, while in yet other embodiments, metal gate 1010 may comprise a pFET gate metal.

In various embodiments, metal gate 1010 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. The gate conductor material may be patterned after formation thereof, and additional CMP steps may be included after the formation of metal gate 1010 to even out any irregular topography and ensure that the top of metal gate 1010 is relatively flat. In embodiments such as the depicted embodiment where multiple FinFET devices formed on the same substrate require different materials for metal gate 1010, block mask technology can be used. In one embodiment, metal gate 1010 has a thickness between 1 nm and 100 nm. Other thicknesses that are lesser than or greater than the aforementioned thickness range can also be used for metal gate 1010.

In various embodiments, hard mask 1000 is used to protect the NFET portion of the current FinFET device (the right side) from the etching, deposition, and planarization steps included in replacing dummy gate 130 with metal gate 1010, in accordance with an embodiment of the invention. In various embodiments, hard mask 1000 is composed of, for example, a dielectric material such as silicon nitride, silicon oxide, or a combination of silicon nitride and silicon oxide deposited using, for example, a process such as LPCVD. A person of ordinary skill in the art will recognize that CMP steps may be inserted before and after the deposition of hard mask 1000 to ensure that the top surface of hard mask 1000 is relatively flat. In various embodiments, standard photolithographic and etching processes may be used to define the structure of hard mask 1000.

Figure 11:
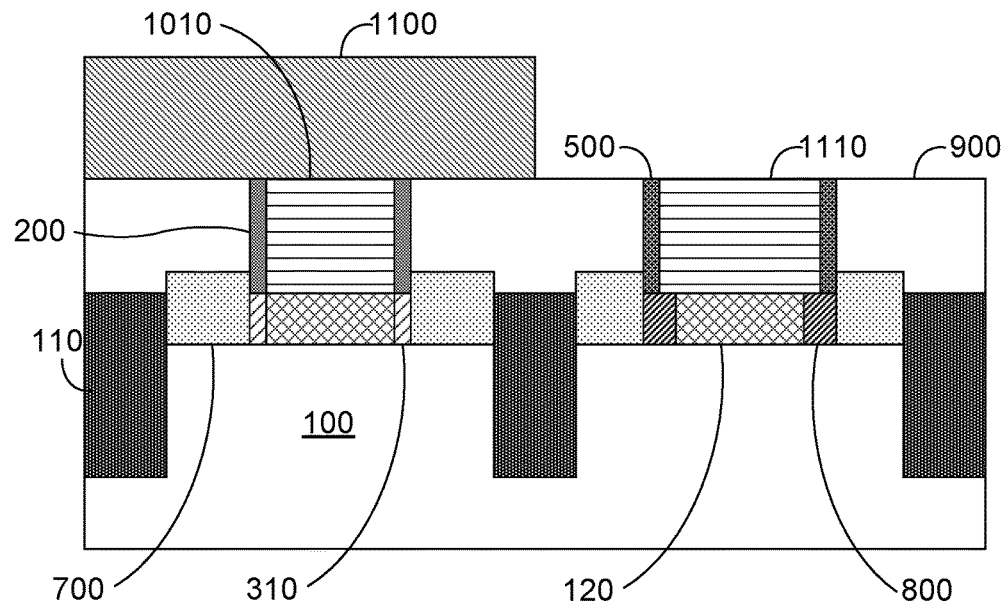
FIG. 11 depicts the removal of the hard mask of FIG. 10, the formation of a new hard mask, and the replacement of the dummy gate of FIG. 1 with a metal gate, in accordance with an embodiment of the invention.

FIG. 11 depicts a section view of the FinFET device after the removal of hard mask 1000, the formation of hard mask 1100 and the replacement of dummy gate 130 and spacer 200 with metal gate 1110, in accordance with an embodiment of the invention. Similarly to metal gate 1010, metal gate 1110 is used to control the operation of the current FinFET device by altering the electric field applied to fin 120. The process of forming metal gate 1110 includes a selective etching process to remove dummy gate 130 and spacer 200 using, for example, RIE, depositing a gate dielectric layer, depositing the material of which metal gate 1110 is to be formed, and planarizing the top of metal gate 1110 to be even with the top of interlayer dielectric 900. In general, the process for forming metal gate 1110 is equivalent to the process of forming metal gate 1010, as described in greater detail with respect to FIG. 10. In some embodiments, two separate etch processes are required to remove both dummy gate 130 and spacer 200 without removing spacer 500. First, dummy gate 130 is selectively removed using an etch process such as RIE. Second, spacer 200 is removed using a selective etch process such as RIE. It should be appreciated that the etch processes used to remove dummy gate 130 and spacer 200 are selected based on the materials of which dummy gate 130 and spacer 200 are formed, and are selected such that neither etch process will remove any portion of spacer 500.

In some embodiments, metal gate 1110 will include a gate dielectric layer (not shown) to prevent direct conduction between metal gate 1110 and fin 120. In various embodiments, the material of which the gate dielectric is formed can be an oxide, nitride, and/or oxynitride. In one example, the gate dielectric material is a high-k dielectric material having a dielectric constant greater than that of silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric comprising different gate dielectric materials, e.g., silicon dioxide, and a high-k gate dielectric can be formed.

The material of which metal gate 1110 is formed can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, metal gate 1110 may comprise an nFET gate metal, while in yet other embodiments, metal gate 1110 may comprise a pFET gate metal.

In various embodiments, metal gate 1110 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. The gate conductor material may be patterned after formation thereof, and additional CMP steps may be included after the formation of metal gate 1110 to even out any irregular topography and ensure that the top of metal gate 1110 is relatively flat. In embodiments such as the depicted embodiment where multiple FinFET devices formed on the same substrate require different materials for metal gate 1110, block mask technology can be used. In one embodiment, metal gate 1110 has a thickness between 1 nm and 100 nm. Other thicknesses that are lesser than or greater than the aforementioned thickness range can also be used for metal gate 1110.

Figure 12:
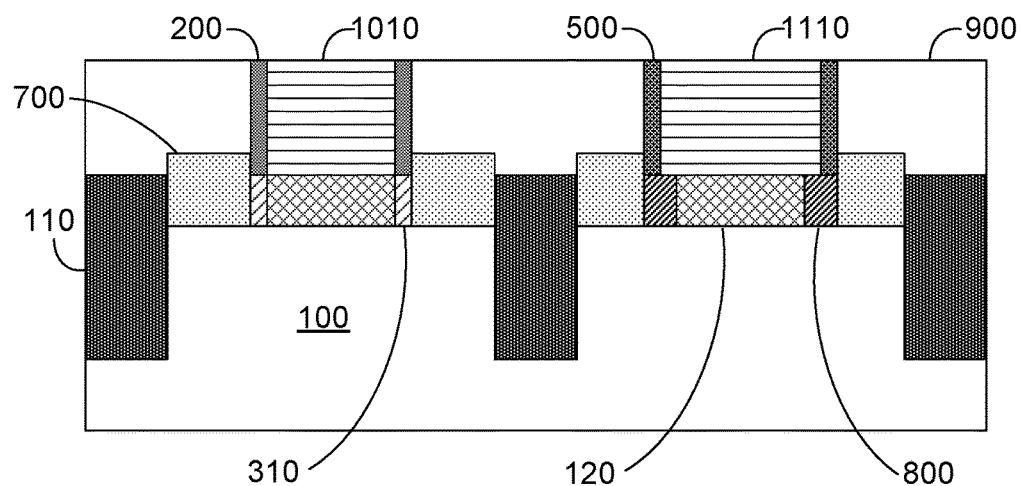
FIG. 12 depicts a section view of the removal of the hard mask of FIG. 11 and the completed FinFET device of the invention, in accordance with an embodiment of the invention.

In various embodiments, hard mask 1100 is used to protect the PFET portion of the current FinFET device (the left side) from the etching, deposition, and planarization steps included in replacing dummy gate 130 and spacer 200 with metal gate 1110, in accordance with an embodiment of the invention. In various embodiments, hard mask 1100 is composed of, for example, a dielectric material such as silicon nitride, silicon oxide, or a combination of silicon nitride and silicon oxide deposited using, for example, a process such as LPCVD. A person of ordinary skill in the art will recognize that CMP steps may be inserted before and after the deposition of hard mask 1100 to ensure that the top surface of hard mask 1100 is relatively flat. In various embodiments, standard photolithographic and etching processes may be used to define the structure of hard mask 1100. FIG. 12 depicts the removal of hard mask 1100, in accordance with an embodiment of the invention. In general, hard mask 1100 is selectively removed using an etch process such as a wet chemical etch. In various embodiments, metal contacts (not shown) are added to the FinFET device to allow the device to be connected to outside electrical components including but not limited to other FinFET devices, additional electrical components such as resistors or capacitors, or any electronic component which can be included in an integrated circuit or a device incorporating an integrated circuit. In various embodiments these contacts may be formed of a material such as tungsten, titanium, or any metal or combination of metals. It should be appreciated by one skilled in the art that the process of forming contacts for the source and drain terminals of the current FinFET device is well known in the art, and that any acceptable method for forming source and drain contacts can be used in various embodiments of the invention.

FIG. 12 depicts a section view of the FinFET device after the removal of hard mask 1100, in accordance with an embodiment of the invention.

In one embodiment, hard mask 1100 is removed using, for example, an etching process such as RIE. In other embodiments, other etching processes such as a wet chemical etch, laser ablation, etc. are used to remove hard mask 1100. In another embodiment, CMP steps are used to remove any portion of hard mask 1100 which is present above the top of interlayer dielectric 900.

In some embodiments, contacts can be formed in the gate, source, and drain terminals of the FinFET device. In general, contacts are formed in later fabrication steps not illustrated in FIGS. 1-12. Contacts are portions of conductive material used to connect the gate, source, and drain region of the device to outside electrical components. Any known method for forming a contact can be used in various embodiments of the invention.

FIG. 12 illustrates the differences in the physical gate lengths between NFET and PFET devices, in accordance with one embodiment of the invention. As a result of the removal of spacer 200 from the NFET device (the right side), metal gate 1110 has a larger width than metal gate 1010. In general, the physical gate length of a device is defined as the width of the gate structure of the finished device, or the distance between the interior edges of the spacers formed on the outsides of the gate structure. As depicted in FIG. 12, the physical gate length of the NFET device (the right side) is larger than the physical gate length of the PFET device (the left side) due to the removal of spacer 200 from the NFET device.

In general, the effective gate length is defined as the distance between the junction regions for the source and drain of a FinFET device. In various embodiments, the junction region of a given FinFET device is defined as the portion of fin 120 which includes any portion of the dopants used in the formation of the source and drain regions of the device. In accordance with FIG. 12, the effective gate length of the PFET device (the left side) is equal to the distance between the interior edges of doped region 310. With respect to the NFET device, the effective gate length is equal to the distance between the interior edges of annealed region 800. The effective gate length is a measure which determines the electrostatic properties of the device, and in general it is desirable that the effective gate length of PFET and NFET devices formed on the same substrate be as close as possible to ensure relatively consistent electrostatic properties between both p-type and n-type devices.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a method of forming a silicon-germanium FinFET device with a controlled junction and a resulting structure (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for forming a FinFET device, the method comprising: providing a semiconductor device, wherein the semiconductor device is an NFET device comprising: a substrate; a fin formed on the substrate, wherein the fin comprises silicon-germanium; a dummy gate formed on the fin; and a first set of spacers formed on exposed sidewalls of the dummy gate; implanting xenon into exposed portions of the fin; forming a second set of spacers on exposed sidewalls of the first set of spacers; subsequent to forming the second set of spacers on the exposed sidewalls of the first set of spacers, implanting a dopant into exposed portions of the fin to form a doped region of the fin, wherein subsequent to implanting the dopant into the exposed portions of the fin, a region of the fin implanted with xenon is laterally adjacent to the doped region of the fin; forming a source/drain region on the fin laterally adjacent to each spacer of the second set of spacers; thermally annealing the semiconductor device, wherein thermally annealing the semiconductor device causes the dopant to diffuse into at least a first portion of the fin; and replacing the dummy gate with a gate structure.

2. The method of claim 1, wherein the gate structure comprises a metal gate and a high-k gate dielectric layer.

3. The method of claim 1, wherein the first portion of the fin comprises at least a portion of the fin located beneath each spacer of the first set of spacers.

4. The method of claim 1, wherein the fin has a composition of at least 25 percent germanium.

5. The method of claim 1, wherein implanting xenon into exposed portions of the fin comprises:
implanting the xenon into the exposed portions of the fin based on, at least, a percentage of germanium present within the fin.

6. The method of claim 1, wherein the dopant is Antimony.

7. The method of claim 1, further comprising:
forming an interlayer dielectric on exposed portions of the substrate and the source/drain region.

8. The method of claim 1, wherein the substrate includes a buried oxide layer (BOX).

9. The method of claim 1, wherein the provided semiconductor device includes an isolation layer adjacent to the substrate and the fin.

10. The method of claim 9, further comprising:
forming a PFET device on the substrate adjacent to the NFET device; and
forming an isolation region between the NFET device and the PFET device.

11. The method of claim 1, wherein:
the semiconductor device further comprises a PFET device separated from the NFET device by an isolation layer; and
thermally annealing the semiconductor device causes:
the NFET device to have a larger physical gate length than the PFET device; and the NFET device and the PFET device to have equal effective gate lengths.

* * * * *